United States Patent
Murphy et al.

(10) Patent No.: US 11,774,504 B2
(45) Date of Patent: Oct. 3, 2023

(54) SYSTEM AND METHOD FOR BATTERY MANAGEMENT

(71) Applicant: Zitara Technologies, Inc., San Francisco, CA (US)

(72) Inventors: Evan Murphy, San Francisco, CA (US); Shyam Srinivasan, San Francisco, CA (US); Mark Tobenkin, San Francisco, CA (US); Zachary Gima, San Francisco, CA (US); Dustin Summy, San Francisco, CA (US); Brian Goodall, San Francisco, CA (US); Elizabeth Goldberg, San Francisco, CA (US); Wen Xing, San Francisco, CA (US); Jacqueline Maslyn, San Francisco, CA (US); Sharon R. Kuo, San Francisco, CA (US); Xander Rudelis, San Francisco, CA (US); John Stefanski, San Francisco, CA (US); Megan Pitcavage, San Francisco, CA (US)

(73) Assignee: Zitara Technologies, Inc., San Francisco, CA (US)

( * ) Notice: Subject to any disclaimer, the term of this patent is extended or adjusted under 35 U.S.C. 154(b) by 0 days.

(21) Appl. No.: 17/959,998

(22) Filed: Oct. 4, 2022

(65) Prior Publication Data
US 2023/0109031 A1   Apr. 6, 2023

Related U.S. Application Data

(60) Provisional application No. 63/251,911, filed on Oct. 4, 2021.

(51) Int. Cl.
*G01R 31/367* (2019.01)
*G01R 31/3842* (2019.01)

(52) U.S. Cl.
CPC ....... *G01R 31/367* (2019.01); *G01R 31/3842* (2019.01)

(58) Field of Classification Search
None
See application file for complete search history.

(56) References Cited

U.S. PATENT DOCUMENTS

| 6,656,234 B2 | 12/2003 | Dexter et al. |
| 7,554,294 B2 | 6/2009 | Srinivasan et al. |

(Continued)

FOREIGN PATENT DOCUMENTS

| DE | 102019111956 A1 | 11/2020 |
| DE | 102019111958 A1 | 11/2020 |

(Continued)

OTHER PUBLICATIONS

"Meta-Model Mechanism", https://www.cs.wmich.edu/~ooda/metamodel.html.

(Continued)

*Primary Examiner* — Brent A. Fairbanks
(74) *Attorney, Agent, or Firm* — Jeffrey Schox; Randy Mehlenbacher

(57) ABSTRACT

A method and/or system configured to select state estimator operation settings based on one or more system inputs; and determine a battery state of a battery, based on sensor measurements associated with the battery, using a state estimator operating under the state estimator operation settings.

19 Claims, 6 Drawing Sheets

(56) References Cited

U.S. PATENT DOCUMENTS

| | | | |
|---|---|---|---|
| 7,894,512 | B2 | 2/2011 | Beadle et al. |
| 8,961,004 | B2 | 2/2015 | Srinivasan et al. |
| 9,593,952 | B2 | 3/2017 | Goodall et al. |
| 10,310,022 | B2 | 6/2019 | Park et al. |
| 10,422,834 | B2 | 9/2019 | Tang |
| 10,818,981 | B2 | 10/2020 | Srinivasan et al. |
| 10,969,752 | B1 | 4/2021 | Brink |
| 11,097,633 | B1 | 8/2021 | Kohn et al. |
| 2004/0024559 | A1 | 2/2004 | Down et al. |
| 2010/0070220 | A1* | 3/2010 | Darilek .............. G01R 31/3828 324/427 |
| 2011/0196633 | A1* | 8/2011 | Abe .................... G01R 31/367 702/63 |
| 2011/0246013 | A1 | 10/2011 | Yee et al. |
| 2012/0098481 | A1 | 4/2012 | Hunter et al. |
| 2012/0175953 | A1 | 7/2012 | Ohkawa et al. |
| 2013/0069660 | A1 | 3/2013 | Bernard et al. |
| 2014/0244225 | A1* | 8/2014 | Balasingam ....... G01R 31/3835 703/2 |
| 2015/0046108 | A1* | 2/2015 | Akamine ............. H01M 10/48 702/63 |
| 2015/0268309 | A1 | 9/2015 | Kim |
| 2015/0280294 | A1 | 10/2015 | Shin et al. |
| 2015/0304772 | A1 | 10/2015 | Risberg et al. |
| 2015/0369875 | A1 | 12/2015 | Ishii |
| 2016/0209472 | A1 | 7/2016 | Chow et al. |
| 2017/0003352 | A1* | 1/2017 | Barre .................. G01R 31/007 |
| 2017/0199247 | A1 | 7/2017 | Joe |
| 2017/0288414 | A1* | 10/2017 | Klein ...................... B60L 58/16 |
| 2017/0350944 | A1* | 12/2017 | Pajovic ............. G01R 31/3648 |
| 2018/0083461 | A1 | 3/2018 | Ravi et al. |
| 2018/0095141 | A1 | 4/2018 | Wild et al. |
| 2018/0111599 | A1 | 4/2018 | Wang et al. |
| 2018/0136285 | A1* | 5/2018 | You ...................... G01R 31/392 |
| 2018/0292465 | A1 | 10/2018 | Osara et al. |
| 2019/0036356 | A1* | 1/2019 | Subbaraman ....... H01M 10/488 |
| 2019/0235027 | A1 | 8/2019 | Sugiura et al. |
| 2019/0339330 | A1* | 11/2019 | Bryngelsson ........ G01R 31/382 |
| 2019/0369626 | A1 | 12/2019 | Lui et al. |
| 2020/0070682 | A1 | 3/2020 | Hellgren |
| 2020/0164763 | A1 | 5/2020 | Holme |
| 2020/0379049 | A1 | 12/2020 | Gray et al. |
| 2021/0055348 | A1 | 2/2021 | Kim et al. |
| 2021/0280920 | A1 | 9/2021 | Rinaldo et al. |

FOREIGN PATENT DOCUMENTS

| | | |
|---|---|---|
| DE | 102019111976 A1 | 11/2020 |
| DE | 102019111979 A1 | 11/2020 |
| DE | 102019121461 B3 | 12/2020 |
| WO | 2020036775 A1 | 2/2020 |

OTHER PUBLICATIONS

Gima, Zachary, et al., "Optimal Sensor Selection for an Electrochemical Li-Ion Battery Model", 2020 ECS—The Electrochemical Society, vol. MA2020-01, A04: Student Battery Slam 4.

Merkle, Lukas, et al., "Architecture of a Digital Twin for Enabling Digital Services for Battery Systems", 2019 IEEE International Conference on Industrial Cyber Physical Systems (ICPS), Taipei, Taiwan, May 6-9, 2019.

Severson, Kristen A., "Data-driven prediction of battery cycle life before capacity degradation", Nature Energy, 4, pp. 383-391 (2019), Mar. 25, 2019.

* cited by examiner

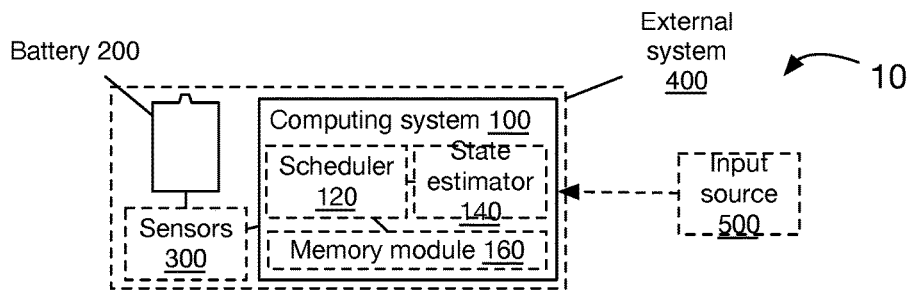
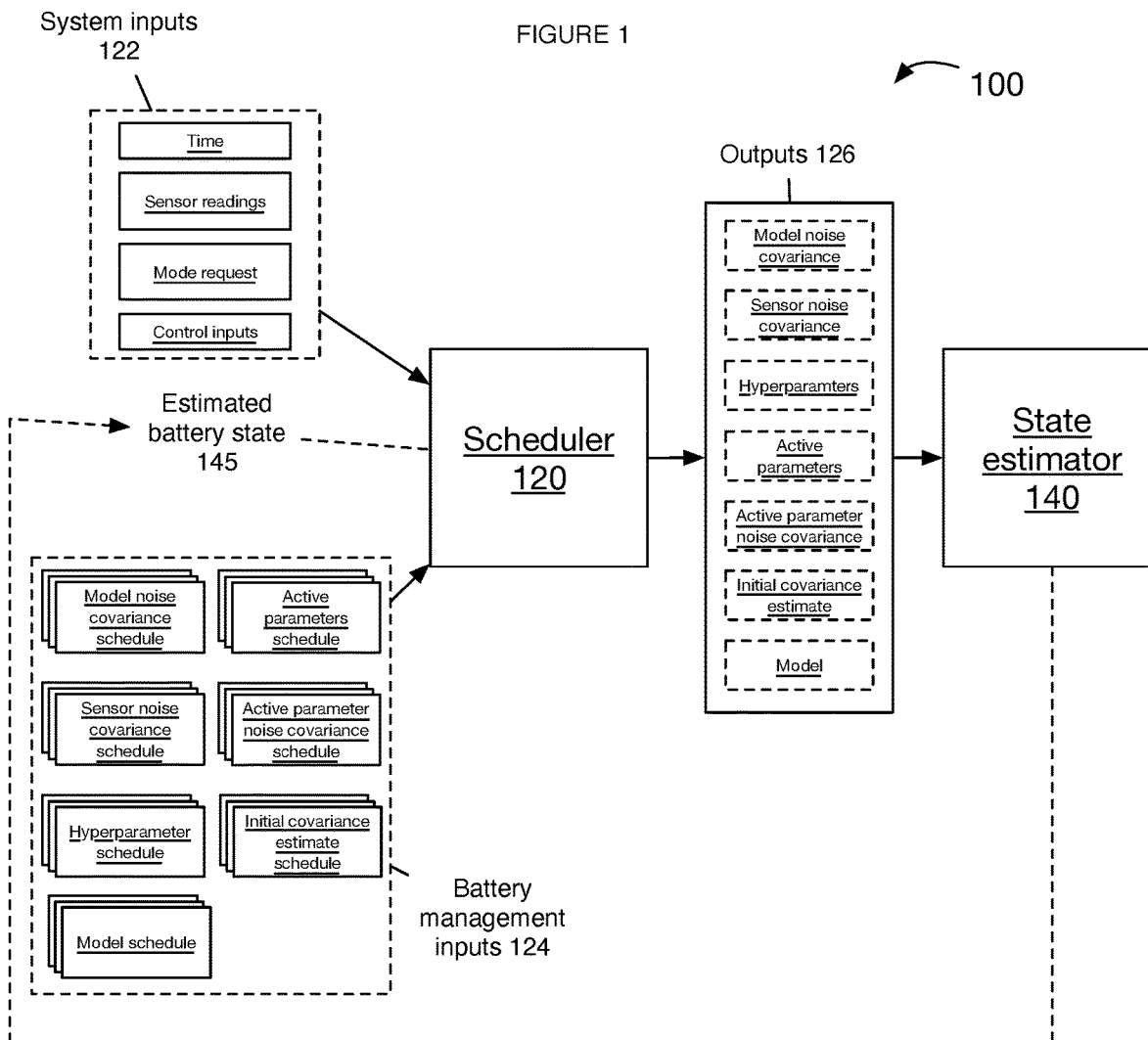
FIGURE 1
FIGURE 2

SYSTEM AND METHOD FOR BATTERY MANAGEMENT

CROSS-REFERENCE TO RELATED APPLICATIONS

This application claims the benefit of U.S. Provisional Application No. 63/251,911, filed 4 Oct. 2021, which is incorporated in its entirety by this reference.

TECHNICAL FIELD

This invention relates generally to the battery management field, and more specifically to a new and useful system and method in the battery management field.

BRIEF DESCRIPTION OF THE FIGURES

FIG. 1 is a schematic representation of the system.

FIG. 2 is a schematic representation of an example of data flow through a scheduler.

DESCRIPTION OF THE PREFERRED EMBODIMENTS

Figure 3:
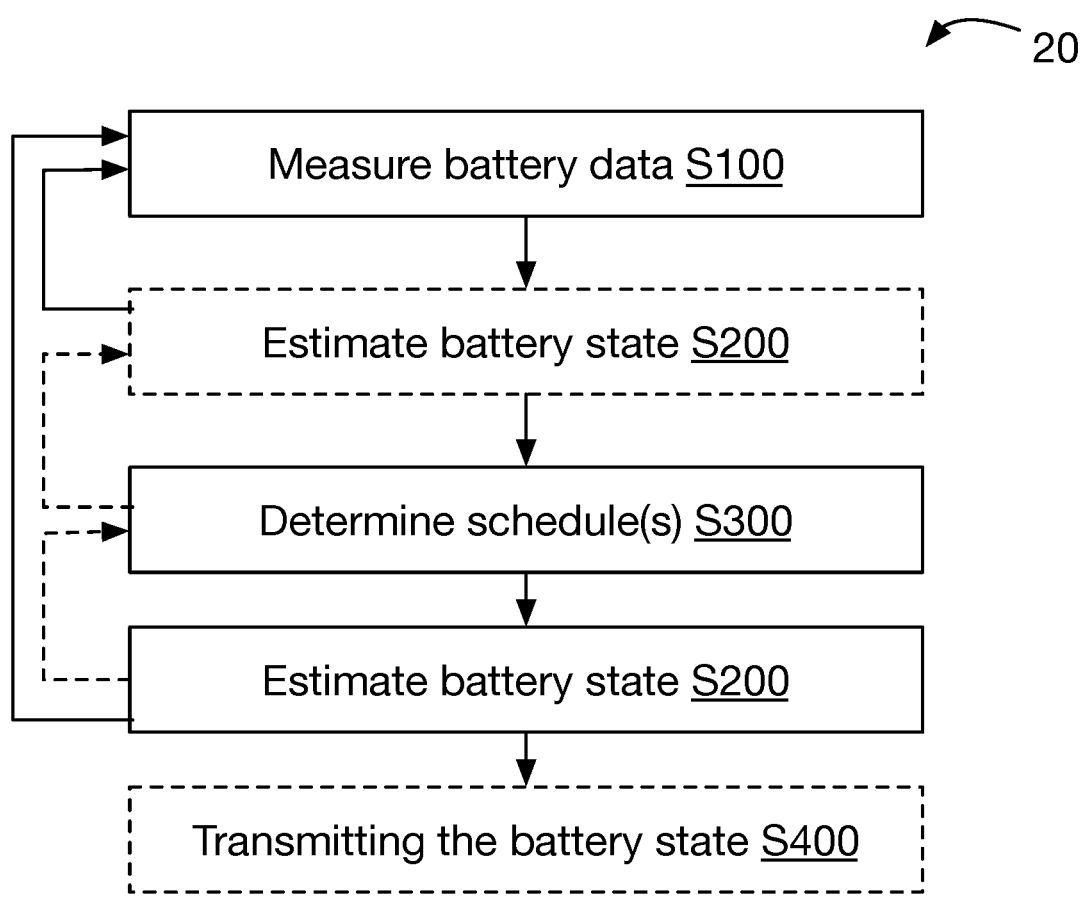
FIG. 3 is a schematic representation of an example of the method.

The following description of the preferred embodiments of the invention is not intended to limit the invention to these preferred embodiments, but rather to enable any person skilled in the art to make and use this invention.

1. Overview.

As shown in FIG. 1, the system can include a computing system, which can include a scheduler, a memory module, a state estimator, and/or any suitable component(s). The system can optionally include a battery, one or more sensors, an input source, and/or any suitable components. The system can optionally include a description of its own operation that can be presented as control inputs to the state estimator.

The system preferably functions to determine state estimator parameters (e.g., information used by and/or relating to the operation of a state estimator) to use for determining (e.g., estimating, calculating, predicting, etc.) a state of a battery and/or battery system. However, the system can otherwise function.

The system is preferably coupled to (e.g., mounted to, connected to, in communication with, etc.) an external system. For instance, a battery of the system can be used to provide power to the external system. Exemplary external systems included: unmanned aerial vehicles (e.g., UAVs, drones, etc.), satellites, rovers, electric vehicles (e.g., electric cars, electric trucks, shipping vehicles, buses, trains, electric passenger vehicles, etc.), electric submarines, electric boats, user devices (e.g., smart phones, computers, power tools, yard tools, etc.), electrical generators, consumer electronics, electric bicycles, scooters (e.g., electric scooters, electric motorbikes, etc.), mobility scooters, wheelchairs, personal transporters (e.g., kick scooters, electric skateboards, self-balancing unicycles, Segway, etc.), electric airplanes, construction equipment, and/or any suitable external system. However, the system can be a stand-alone system and/or any suitable system.

2. Benefits.

Variations of the technology can confer several benefits and/or advantages.

First, variants of the technology can determine preferred (e.g., optimal such as fastest, most accurate, long-term prediction, etc.) parameters for a state estimator. This can result in more accurate, more precise, more efficient (e.g., for a given accuracy or precision), and/or otherwise impact (e.g., improve) state estimation using the state estimator (e.g., as compared to a state estimator that does not use or include a scheduler). For instance, a scheduler can enable finer or more granular control over the state estimator operation (e.g., compared to using a state estimator without a scheduler). For example, a scheduler can ingest sensor data, mode selections, battery state (e.g., estimated from a state estimator), system time, control inputs, and/or any suitable data to determine (e.g., select) parameters (e.g., state estimator operation conditions, modes, etc.) for the state estimator.

Second, the inventors have discovered that variants of the technology can enable domain knowledge (e.g., contextual knowledge of how the battery is being used, information about the state estimator's component systems' performance, such as in estimating the battery state, under various conditions, control inputs, etc.) to be used to inform the parameter selection (e.g., which can be difficult to encode within a state estimator or model thereof). In contrast, state estimators typically operate with parameters optimized for performance over the entire range of operating conditions, resulting in decreased overall performance. In related variants, the use of domain knowledge can improve computational performance or efficiency, for instance, by having the state estimator estimate fewer states when appropriate (e.g., because one or more states are unlikely to vary in a particular situation, because one or more states are unlikely to be accurately determined in a given situation, as determined by the scheduler, based on the domain knowledge, etc.).

However, variants of the technology can confer any other suitable benefits and/or advantages.

3. System.

As shown in FIG. 1, the system can include a computing system, which can include a scheduler, a memory module, a state estimator, and/or any suitable component(s). The system can optionally include a battery, one or more sensors, an input source (e.g., a user interface such as a touchscreen, stylus, buttons, haptics, auditory, user input, etc. at an operator device, the external system, a user device, etc.), and/or any suitable components. The system preferably functions to determine state estimator operation parameters that a state estimator can use for determining (e.g., estimating, calculating, predicting, etc.) a state of a battery and/or to determine the state of the battery system. However, the system can otherwise function.

The battery(s) 200 function to provide power to the computing system, the external system, and/or a component thereof (e.g., a motor, a camera, load, etc.), and/or can otherwise provide power to any suitable components or systems. The battery(s) are preferably secondary cells (e.g., rechargeable battery), but can be primary cells (e.g., not rechargeable battery), and/or any suitable battery, capacitor, and/or supercapacitor. The battery is preferably mounted to the external system, but can be remote from the external system (e.g., provide energy to the external system wirelessly), and/or can otherwise be arranged.

Each battery can include one or more: battery cells (e.g., a container to store chemical energy such as a prismatic battery cell, pouch battery cell, cylindrical battery cell, etc.; including an anode, cathode, separator, electrolyte, etc.), battery modules (e.g., groups or clusters of battery cells), battery packs (e.g., an enclosure that includes one or more battery cells or battery modules, processors configured to run software, heating and/or cooling systems, etc. that delivers power to the components of the external system), and/or any suitable components.

Each battery can be described by a set of battery properties. The battery properties can be cell-specific properties, module-specific properties, pack-specific properties, generic properties, and/or any suitable properties. The properties can be static (e.g., fixed such as determined at the time of installation or manufacture) and/or variable (e.g., change during operation of the battery, change over time as the battery ages, change depending on the number of battery operation cycles, etc.). Battery properties can be: directly measured; calculated, derived, inferred, or estimated (e.g., from directly measured battery properties, from simulations, from charging or discharging the battery, etc.); received (e.g., from a manufacturer, from an operator, from a data sheet, etc.), and/or otherwise be accessed. Battery properties can include internal battery properties and/or external battery properties (e.g., properties associated with an environment that the battery is in).

Exemplary battery properties include: voltage (e.g., open circuit voltage, instantaneous voltage, end-of-life voltage, beginning of life voltage, voltage limits, etc.), current (e.g., short circuit current, instantaneous current, end-of-life current, beginning-of-life current, current limits, taper currents, etc.), temperature (e.g., internal temperature, surface temperature, environment temperature, set temperature, local temperature, average temperature, etc.), temperature gradient (e.g., within an external system, across a battery cell, across a battery module, across a battery pack, etc.), humidity, pressure (e.g., environmental pressure, mechanical pressure, air pressure, etc.), resistance (e.g., internal resistance, ohmic resistance, capacitive resistance, inductive resistance, instantaneous resistance, etc.), impedance, capacity (e.g., specific capacity), capacitance (e.g., effective capacitance), inductance, component thickness (e.g., anode thickness, cathode thickness, separator thickness, solid-electrolyte interface layer thickness, etc.), particle radius (e.g., anode particle radius, cathode particle radius, etc.), transference number, Brugman number, solution diffusivity, solution volume fraction (e.g., anode, cathode, separator, etc. solution volume fraction), diffusivity (e.g., anode solid diffusivity, cathode solid diffusivity, etc.), reaction rate (e.g., anode reaction rate, cathode reaction rate, etc.), materials (e.g., cathode material, anode material, electrolyte material, separator, etc.), geometry, size, solution conductivity, entropic heating coefficient, thermal conductivity, electrical conductivity, thermal mass, C-rate (e.g., nominal C-rate, maximum C-rate, etc.), charge (e.g., maximum charge, charge current limit, discharge current limit, delivered charge, stored charge, etc.), state (SoX) of the battery (e.g., state of charge (SoC), state of health (SoH), state of power (SoP), state of safety (SoS), etc.), energy (e.g., energy delivered since last charge or discharge, total energy delivered for a given period of time, etc.), power, time (e.g., time since last charge or discharge, age, remaining lifetime, etc.), battery age (e.g., time since battery manufacture, total number of charging and/or discharging cycles, amount of time the battery has been at a target or threshold charge, etc.), ion concentration (e.g., lithium ion concentration), and/or any suitable properties.

The optional sensor(s) 300 function to measure one or more battery properties, external system properties, environmental conditions (e.g., of an environment proximal to, surrounding, adjacent to, near, etc.) of the battery or external system, and/or any suitable properties. The sensors are preferably connected to (e.g., in contact with) the battery(s). However, the sensors can be collocated with (e.g., mounted to) the external system, remote from the external system (e.g., a wireless sensor), and/or otherwise be configured. In variants, each cell of a battery can include a sensor, each module of a battery can include a sensor, each battery pack can include a sensor, a subset of cells can include a sensor, a subset of modules can include a sensor, a subset of packs can include a sensor, and/or the sensor can otherwise be associated with any suitable battery(s) and/or load (e.g., a motor, radio, camera, light, resistor, capacitor, etc. such as of an external device).

Exemplary sensors include: battery management systems (BMS) monitors, thermometers, pressure gauges, external system sensors (e.g., odometers, altimeters, power sensors, etc.), anemometer, weather sensors (e.g., illumination sensors, humidity sensors, road condition sensors, etc.), clocks, electrochemical impedance spectroscopy (EIS) sensors, voltmeters, ammeters, ohmmeters, multimeters, and/or any suitable sensors (e.g., any sensor whose reading is directly or indirectly affected by the battery state).

Figure 4A:
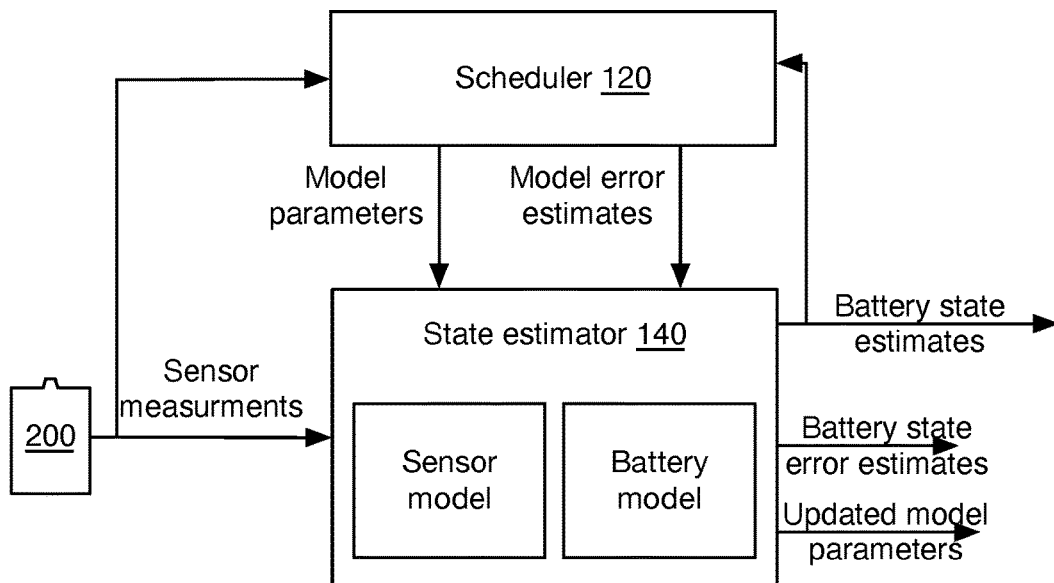
FIGS. 4A and 4B are schematic representations of examples of distributed computing systems for a scheduler and connected state estimator(s).
Figure 4B:
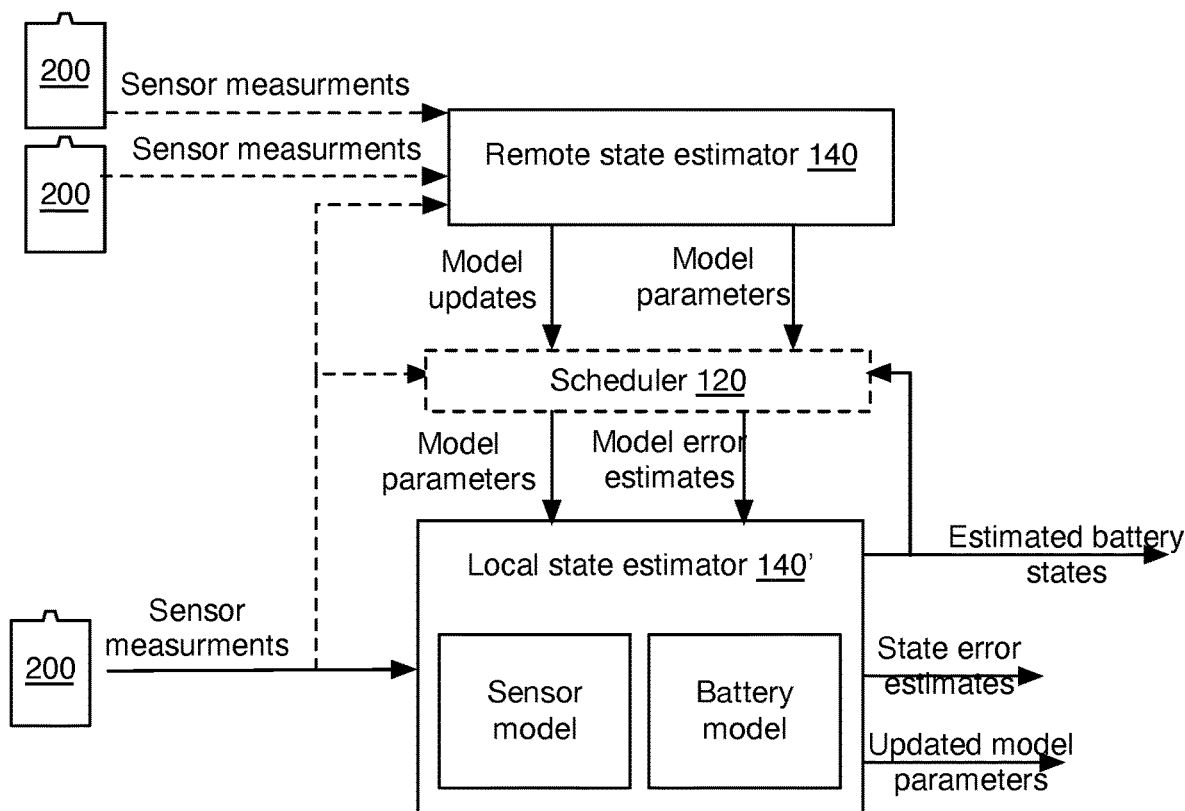

The computing system 100 preferably functions to determine a state of the battery, determine one or more state estimator operation parameters used to determine the state of the battery, and/or can otherwise function. The computing system can be local (e.g., to the system, to the external system, as shown for example in FIG. 4A, etc.), remote (e.g., server, cloud computing system, etc.), and/or distributed (e.g., between an edge or local computing system and a remote computing system, between two or more local computing systems, between remote computing systems, as shown for example in FIG. 4B, etc.). The computing system can include any suitable processors, microprocessors, memory, controllers, and/or other components.

The computing system can include: a memory module 160, a scheduler 120 (e.g., mode scheduler), a state estimator 140, and/or any suitable components.

The memory module 160 preferably functions to store data and/or information (e.g., the schedule, battery states, sensor data, sensor readings, etc.) such as for future retrieval. The memory module can be fixed (e.g., read only) and/or variable (e.g., enable read and write functionality). The memory module can be integrated into a local and/or remote computing system.

The scheduler 120 preferably functions to determine (e.g., select) one or more modes (e.g., to be used by a state estimator) from a schedule. The mode(s) are preferably selected from the memory module (e.g., a database), but can be calculated (e.g., based on information stored in the memory module, based on one or more inputs, etc.) and/or otherwise be determined. The scheduler can be implemented on a local and/or remote computing system.

The schedule(s) 124 are preferably a set of modes (e.g., state estimator operation parameters, state estimator conditions, state estimator operation conditions, state estimator operation information, state estimator information, information used by a state estimator to determine a state, etc.) that is usable by the state estimator to determine (e.g., calculate, estimate, etc.) a state of the battery. Each mode is typically represented as a matrix, but can additionally or alternatively be represented as a scalar, vector, tensor, string, and/or using any suitable data representation. In some variants, a shared matrix can be used to represent more than one mode (for example the mode can indicate which rows, columns, elements, etc. of the shared matrix to set to 0).

The mode selected from the schedule can be selected to improve the accuracy, efficiency (e.g., to operate in a more efficient manner such as without or with at most a threshold impact to the accuracy), validity, and/or other quality of the state estimator and/or state estimation (e.g., future predicted state). Typically, a different mode is used (e.g., selected) for different conditions (e.g., state estimator operation conditions, battery operation conditions, scheduler operation conditions, battery state, environmental conditions, inputs, etc.). However, a mode can be used for more than one condition (e.g., for different applications, depending on a processor bandwidth, depending on an available memory, etc.).

The scheduler preferably selects the mode according to a set of conditions (e.g., where the set of conditions can be part of the mode, associated with the schemodedule, and/or otherwise can be related to the mode). However, the scheduler can additionally or alternatively select the mode using a look-up table, a decision tree, artificial intelligence, and/or in any manner. For example, one or more inputs (or outputs) can be compared to the conditions (e.g., threshold values or conditional values for the inputs) and the mode which is appropriate for the conditions can be selected. However, inputs can be combined and/or the mode can otherwise be selected. Exemplary conditions include: modes (e.g., a mode associated with a mode that is higher in a hierarchy of modes), battery state (e.g., estimated battery state), battery operation (e.g., charging, discharging, rate of charging, rate of discharging, etc.), system time, sensor readings, and/or any suitable input(s) and/or other information can be used as a condition.

The conditions used to select a mode can be prioritized or not prioritized. The conditions can be hierarchical, uncorrelated, unambiguous (e.g., uniquely define or be associated with a mode of the schedule), combined (e.g., to generate a score or metric for mode selection), and/or can otherwise be related or unrelated.

For instance, one or more conditions can be compared to one or more thresholds (e.g., each condition can be compared to one or more thresholds) where the mode(s) can be selected based on the mode(s) that meet the conditions. For example, a first input can be compared to a first, second, third, etc. input threshold each associated with the first input; a second input can be compared to a first, second, third, etc. input threshold associated with the second input; and so on for additional inputs. As a concrete (and nonlimiting) example, sensor readings (e.g., current, voltage, temperature, etc.) can be compared to a first threshold, a second threshold, and a third threshold. In this concrete example, when the sensor reading(s) are less than the first threshold, a first mode can be selected; when the sensor reading(s) are greater than the first threshold and less than the second threshold, a second mode can be selected; when the sensor reading(s) are greater than the second threshold and less than the third threshold; a third mode can be selected; and when the sensor reading(s) are greater than the third threshold, a fourth mode can be selected. In some variations on this concrete example, when the sensor reading(s) are less than the first threshold or greater than the third threshold, no mode (e.g., no state estimator conditions or state estimator inputs) can be selected (e.g., because the state estimator or inputs thereof have not been validated for those conditions).

In some variations, the thresholds (e.g., thresholds used for mode selection) are dynamic thresholds (e.g., vary in time). Dynamic thresholds can be beneficial for smoothing and/or accommodating a hysteresis in the mode selection (e.g., to reduce the frequency of mode changing when one or more inputs are close to a threshold between two or more modes, to accommodate noise in one or more inputs, etc.). For example, the threshold values can depend on a battery age, a system operation time, an amount of time elapsed since a mode was selected, an amount of time elapsed since a mode changed, and/or can depend on any suitable timing. The dynamic thresholds can vary smoothly (e.g., according to a function of time) and/or discretely (e.g., a step function change, delta change, etc.). The dynamic thresholds can change instantaneously and/or smoothly. For example, a threshold can increase and/or decrease (e.g., depending on whether an input increased or decreased to cross the threshold) by a predetermined amount (e.g., percentage such as 0.01%, 0.05%, 0.1%, 0.5%, 1%, 5%, 10%, 20%, 50%, values therebetween, etc.; fixed amount such as 0.001, 0.005, 0.01, 0.05, 0.1, 0.5, 1, 5, etc. where the fixed amount can be normalized to a unitless value, fixed amount in a unit associated with the input, etc.; etc.).

A characteristic time of a dynamic threshold (e.g., time before the threshold returns to a baseline value, time before the threshold changes by a predetermined amount, etc.) can be the same or different for different thresholds. The characteristic time can depend on the application of the battery, a storage size (e.g., depend on the amount of available memory), depend on a target accuracy or precision of the estimated state(s), depend on the battery, depend on the battery properties, depend on the external system, depend on an advisory board (e.g., a governmental agency), depend on a model (e.g., model type, number of models, etc.), depend on the state estimator, depend on the sensor(s) (e.g., number, type, data latency, etc.), depend on a hysteresis of the state estimator (e.g., a sensitivity of the state estimator to changes in the mode), a magnitude of change between the modes (e.g., with larger differences between modes often associated with larger characteristic times), depend on a data latency, depend on a state estimator latency, and/or can otherwise depend on any suitable data or information. Exemplary characteristic times can be less than 1 second, 1 second, 5 seconds, 10 second, 20 seconds, 30 seconds, 45 seconds, 60 seconds, 120 seconds, 180 seconds, 240 seconds, 300 seconds, 600 seconds, greater than 600 seconds, and/or values therebetween.

Figure 8A:
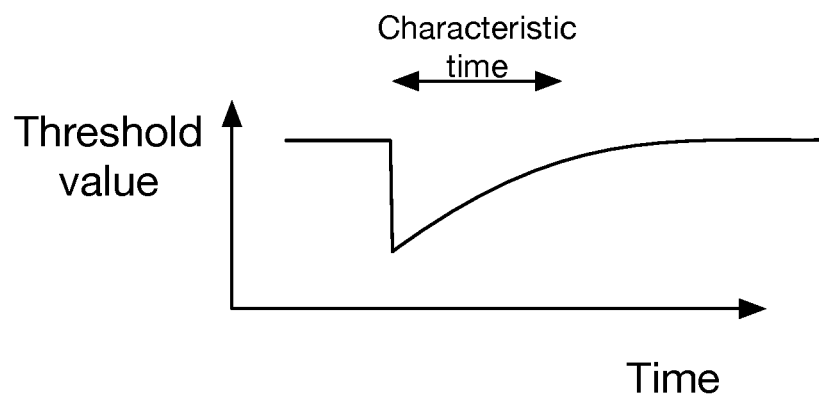
FIGS. 8A and 8B are schematic representations of exemplary dynamic thresholds for mode selection.
Figure 8B:
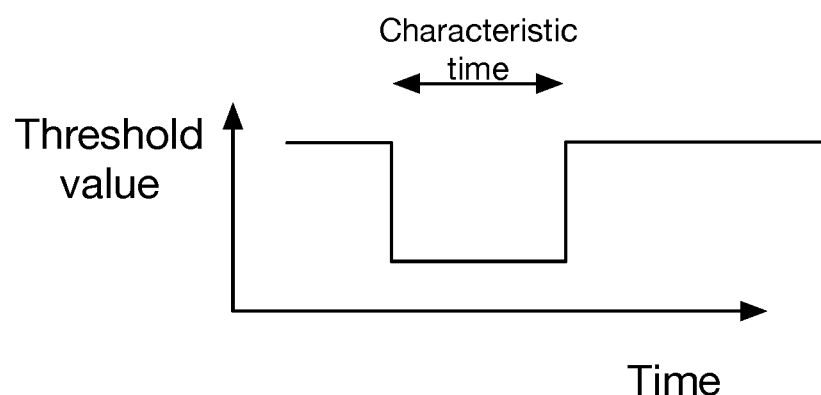

As a first illustrative example (as shown for instance in FIG. 8A), a dynamic threshold can follow an equation (e.g., polynomial equation, exponential equation, logistic equation, logarithmic equation, etc.) as a function of time. As a second illustrative example (as shown for instance in FIG. 8B), a dynamic threshold can be discontinuous (e.g., step-like behavior) in time.

However, one or more thresholds can be static, a different threshold can be set to cross from one mode to another and vice versa (e.g., one threshold can be used to go from a first mode to a second mode while a second threshold can be used to go from the second mode to the first mode), and/or any suitable threshold can be used.

In some variants, for instance when a battery is operating in a condition (e.g., state, sensor readings, etc.) with no associated validated mode, a default mode can be selected, a previous mode can be used, a flag can be issued (e.g., indicating that no validated modes are available), one or more existing modes can be combined (e.g., interpolated, extrapolated, etc.) to generate a mode, and/or any suitable mode can be used and/or response can occur.

In variants, the scheduler can operate in different operation conditions (e.g., different modes of operation, scheduler operation conditions, etc.). Examples of operation conditions include a high accuracy condition (e.g., a condition optimized, trained, operable to, etc. select one or more modes for high accuracy state estimator operation), a low accuracy condition (e.g., a condition optimized, trained, operable to, etc. select one or more modes for low accuracy state estimator operation such as for faster, less compute, etc. state estimator operation), high performance condition (e.g., a condition optimized, trained, operable to, etc. select one or more modes for use with a state estimator operating in a constrained compute system, for use with a state estimator to enable fast operation or generation of a state estimate, etc.), a low performance condition (e.g., a condition optimized, trained, operable to, etc. select one or more modes for low accuracy state estimator operation such as for faster, less compute, etc. state estimator operation), a high precision condition (e.g., a condition optimized, trained, operable to, etc. select one or more modes for high precision state estimator operation), a low precision condition (e.g., a condition optimized, trained, operable to, etc. select one or more modes for low precision state estimator operation such as for faster, less compute, etc. state estimator operation), a deterministic condition (e.g., a condition that given the same inputs will generate the same outputs), a probabilistic condition (e.g., a condition that can generate different outputs for the same inputs such as by probabilistic selection of a mode from a schedule), a charging condition (e.g., a condition to be used when the battery is charging), a discharging condition (e.g., a condition to be used when the battery is discharging), a static condition (e.g., a condition to be used when a battery is not in use), and/or any suitable mode(s) of operation.

In one illustrative example of a high accuracy and/or precision condition compared to a low accuracy and/or precision performance mode, the mode(s) selected by a high accuracy and/or precision performance condition can be included with a greater accuracy, can retain smaller covariances and/or coefficients, and/or can include any suitable information. For instance, in the high accuracy and/or precision mode, any element (e.g., of a matrix) with magnitude greater than 10-4 (e.g., in the respective units, normalized value, etc.) can be included in the schedule while in the low accuracy and/or precision mode, any element (e.g., of a matrix) with magnitude greater than $10^{-1}$ (e.g., in the respective units, normalized value, etc.) can be included in the schedule. In another illustrative example, the mode(s) selected by a high accuracy and/or precision condition can have a larger number of elements (e.g., be a larger matrix, be associated with more complex models, etc.) compared to the mode(s) selected by a low accuracy and/or precision performance mode. For instance, in a high accuracy and/or precision condition a 3×3 matrix associated with a 3RC model could be selected, whereas a related low accuracy and/or precision condition could select a 2×2 matrix associated with a 2RC model. However, a scheduler can operate in a low and/or high accuracy and/or precision condition in any suitable manner.

The scheduler can automatically change between operation conditions (e.g., upon detection that a computation bandwidth changes an accuracy and/or precision condition can be changed), can be changed according to a predetermined timing (e.g., at predetermined times, at a predetermined frequency, etc.), can be changed responsive to a signal (e.g., threshold sensor measurement, threshold state determination, etc.), can be changed manually (e.g., by an operator), can be fixed (e.g., set once and not changed), and/or can otherwise be selected and/or changed.

Different operation conditions can access the same and/or different schedules. For example, a low accuracy condition can access a schedule (and/or modes) associated with computationally simple models (e.g., linear model) whereas a high accuracy condition can access a schedule (and/or modes) associated with computationally complex models (e.g., nonlinear models). In another example, a low accuracy condition and a high accuracy condition can access the same schedule (e.g., computationally simple and/or complex models); however, the different operation conditions can weight the mode(s) differently for selection (e.g., favoring a lower or higher accuracy model). However, different scheduler operation conditions can operate in any manner.

The modes can be associated with a mode group, where each mode group is typically associated with a different subset of information that can be used by the state estimator. However, all of the modes can be associated with the same mode group (e.g., modes can include all information for state estimator), and/or the modes can otherwise be related. Different modes groups can be independent (e.g., unrelated), hierarchical (e.g., a first mode group can influence the selection and/or data in a second mode group but not vice versa), interdependent (e.g., a first and second mode group can be interrelated, depend on one another, etc.), and/or otherwise be related. As an illustrative example (e.g., of a hierarchical relationship between mode groups), a first mode group can be a condition for a second mode group (e.g., the choice or selection of a mode from the first mode group can be a criterion for the selection of a mode from the second mode group).

In a specific example as shown in FIG. 2, mode groups can include a model (e.g., model noise covariance, which parameters are being estimated, which parameters and/or states are active and/or inactive, covariances for estimated parameters, which model(s) are used, etc.), a sensor noise covariance, state estimator hyperparameters, active parameter, active parameter noise covariance, initial covariance estimate, and/or any suitable modes. In variations of this illustrative example, the noise covariance of various state estimator components (e.g., states, sensors, active model parameters, etc.), can depend on the model (e.g., while the model can be independent of the noise covariance). Similarly, the hyperparameters can depend on the noise covariance and/or model (e.g., while the noise covariance and/or the model can be independent of the hyperparameters). However, any suitable mode group(s) can be used and/or the mode groups can be related in any manner.

The number of modes (e.g., total number of modes, number of modes in a mode group, number of mode groups, etc.) can depend on an application of the battery, a storage size (e.g., depend on the amount of available memory), depend on a target accuracy or precision of the estimated state(s), depend on the battery, depend on the battery properties, depend on the external system, depend on an advisory board (e.g., a governmental agency), depend on a model (e.g., model type, number of models, etc.), depend on the state estimator, depend on the sensor(s) (e.g., number, type, data latency, etc.), computing system properties (e.g., memory, processing limits, datalink bandwidth, etc.), and/or can depend on any suitable data or information. For example, the number of modes can be between 1-100 (or any value therebetween). However, the number of modes can be greater than 100 and/or any suitable value.

The modes (e.g., number, type, information contained within, etc.) can be determined empirically, heuristically, based on modelling, trained (e.g., based on a characterized dataset), based on a physical model, and/or be determined or derived in any manner. The mode(s) (and/or schedule) are preferably predetermined (e.g., before an application of a battery, before use of an external system, before implementing a state estimator, etc.), but can be determined in real-time (e.g., during operation of the system). In some variants, the modes can be updated. For example, when a situation (e.g., set of conditions) is found that is poorly described by existing mode(s), a new mode can be trained or otherwise determined that is applicable to the situation, where the new mode can be included in the schedule.

The schedule (and/or modes thereof) are preferably, but do not have to be, validated. Relatedly, new modes are preferably validated before inclusion within the schedule. The mode(s) can be validated, for instance, by using the modes (e.g., in combination with state estimator(s)) to predict states (generated using the model and/or state estimator) that can be compared to measured states for analogous load profiles and analogous batteries. When the difference between the measured states and the predicted states is less than a threshold (that can depend on the number of modes, a target accuracy, a target bandwidth, etc.), a mode can be validated. However, a mode can additionally or alternatively be validated based on a previously validated mode (e.g., a validated mode can be used to generate a second mode where the second mode is validated based on the validation of the original mode), validated by simulating historic states and comparing the simulated historic states to the simulated states, and/or can be validated in any manner.

The mode(s) (and/or schedule) can be validated for a time span (e.g., a predetermined amount of time, for as long as a validation criterion is satisfied, etc.), indefinitely, and/or for any amount of time. The mode(s) can be validated once; at predetermined times; at a predetermined frequency; in response to a change or update to the model, state estimator, battery, and/or other component; in response to a request from an operator; in response to a request from a regulatory body or agency; randomly or pseudo-randomly; and/or at any time.

Typically, a mode (e.g., set of state estimator operation parameters) is validated for a narrow range of conditions. For instance, a mode can be validated only for use when the battery state, sensor measurements, and/or other inputs to the scheduler meet the threshold(s) (e.g., less than, between, or greater than the threshold associated with the mode). In another instance, the mode can be validated over a larger range than the mode can be selected over (e.g., the thresholds can be more conservative than the validity range of a mode such as to account for lag between state updates, sensor measurements, scheduler operation, etc.). As an illustrative example, a mode selection threshold could be a voltage reading between 2.7 and 2.9 V while the same mode could be valid (e.g., validated) for voltage readings between 2.6 and 2.95V. However, a mode can be validated for any suitable conditions.

New mode can be uploaded to the scheduler and/or memory module in real time (e.g., during battery system operation), when a threshold bandwidth is available, offline (e.g., during battery system charging, when the battery system is at rest, etc.), and/or with any suitable timing.

Inputs 122 to the scheduler can include: sensor readings 1221 (e.g., sensor data 310), operation time 1222 (e.g., amount of time the battery and/or system thereof has been operating, operation time for current implementation, total operation time, time since last charge, time since last discharge, time since the battery was in a predetermined state or condition, estimated time until the battery reaches a target state, system time, etc.), a mode request 1223, an operation state of the battery system 1224 (e.g., charging, discharging, plugged in, unplugged, battery use profile, predicted battery use profile, instantaneous power draw, average power draw, etc.), the mode 126 (e.g., model, model noise covariance matrices, sensor noise covariance matrices, hyperparameter matrices, combined matrices, etc.), an estimated battery state 145 (e.g., determined using the state estimator, determined using an initial battery state estimator, using a scheduler battery state estimator such as a dedicated state estimator for determining a battery state prior to a mode selection, etc.), state estimator parameters 1225 (e.g., predicted state estimator parameters, estimated state estimator parameters, initial state estimator parameters, etc.), control or command inputs 1226 (e.g., from an embedded system; rest; charging; discharging; rate of discharge or charge; power draw; heat flux; load profile; configuration information such as power draw, heat flux, load profile, etc. for given battery system settings; known battery properties; independently determined battery properties; etc.), state of the model 1227 (e.g., evaluate the model to estimate dependent variables such as heat flux, voltage, current, intermediate terms from the model, etc.), and/or any suitable inputs. The inputs can be generated or provided by the system, by a system operator, by a battery system operator or user, and/or by any suitable user and/or computing system. In a specific example (as shown in FIG. 2), inputs to the scheduler can include system inputs (e.g., time, age, sensor readings, mode request, mode of operation or operation condition, control inputs, client provided inputs, etc.), state estimates (e.g., generated by a state estimator that is to use a mode, generated by an independent state estimator, prior states, etc.), and battery management inputs (e.g., modes, schedule, etc.).

Outputs 126 from the scheduler are preferably one or more selected mode(s) from the schedule. When the mode(s) are associated with more than one mode group, one selected mode from each mode group is preferably output. However, in some variants, only modes from a subset of the mode groups can be output, more than one mode from a mode group can be output, and/or any suitable modes can be output. However, the outputs can additionally or alternatively include any suitable input and/or any suitable information (e.g., a confidence or score associated with the selected mode(s)).

Figure 5:
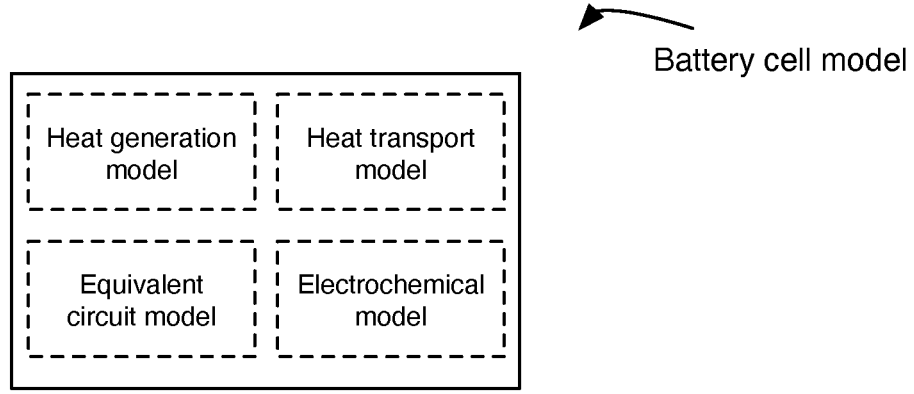
FIG. 5 is a schematic representation of an exemplary battery cell model.
Figure 6:
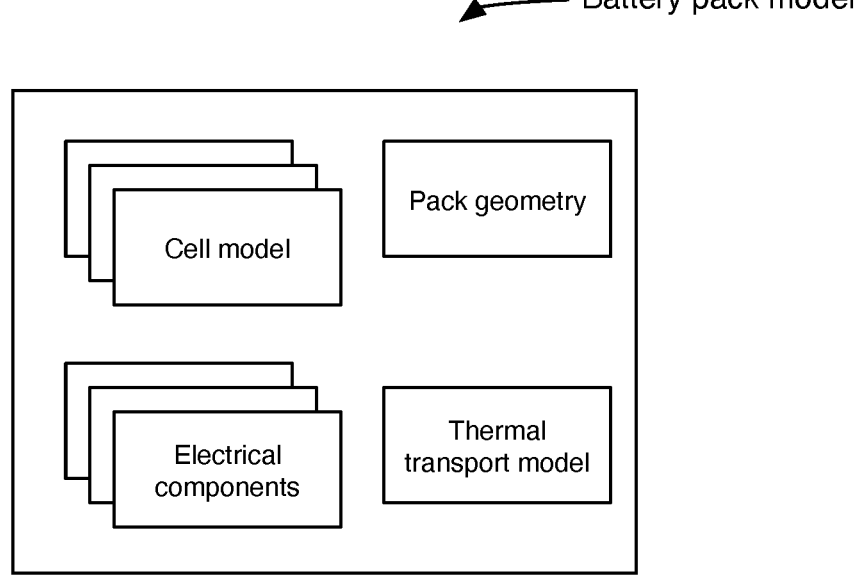
FIG. 6 is a schematic representation of an exemplary battery pack model.

Information in each mode can include: conditions (e.g., conditions for use of the mode, conditions when the mode is valid, conditions when the mode is accurate, etc.), state estimator parameters (e.g., parameters, initial parameters, and/or other suitable information to be used by the state estimator), information used to determine (e.g., derive) state estimator parameters (e.g., be a tag that can be used to look-up the state estimator parameters, be coefficients that can be used to calculate the state estimator parameters, etc.), and/or any suitable information. Exemplary modes (e.g., state estimator operation parameters) can include: one or more models 1241 (e.g., control input models, state evolution model, battery cell models, battery module models, battery pack models, electrochemical models, equivalent resistance models, quantum chemical models, kinetic models, thermodynamic models, thermal models, heat transport models, diffusion models, models as shown for example in FIG. 5 or FIG. 6, model as disclosed in U.S. patent application Ser. No. 17/502,565 titled 'BATTERY ANALYSIS SYSTEM AND METHOD' filed 15 Oct. 2021 which is incorporated in its entirety by this reference, etc.), model parameters 1242 (e.g., active parameters, inactive parameters, etc.), noise covariances (e.g., model parameter noise covariance 1243, sensor noise covariance 1244, active parameter noise covariance 1245, etc.), initial covariance estimates 1246, hyperparameters 1247, states 1248 (e.g., active states, inactive states, etc. of the state estimator), and/or any suitable information.

The models mode can include battery models, sensor models, and/or any suitable models. The sensor model(s) can function to model how sensor data is acquired, an error associated with sensor measurements, sensor biases, and/or otherwise model the sensor behavior. The battery models are preferably physical models (e.g., model a physical aspect of the battery; model battery physics; etc.), but can alternatively be conceptual models or other models. The battery models can function to model (e.g., form a representation of) how the battery operates and/or responds to charging or discharging. For example, battery models can simulate electrical effects, thermal effects, diffusion effects, ion effects, electrochemical effects, and/or any suitable effects.

The models are preferably parameterized models, but can be or include nonparameterized models, machine learning models (e.g., neural networks), and/or any suitable model types. Parameterization generally refers to what independent variables are associated with a dependent variable and a functional form for how the dependent variable changes with the independent variable. Parameterization can additionally or alternatively include: what elements are lumped together (e.g., how many individual units are described by a given term), and/or otherwise be defined. In an illustrative example, open-circuit voltage (U) can be parameterized as a function of state of charge (SoC), temperature (T, e.g., internal temperature of the battery, environmental temperature, etc.), and/or age of the battery such as: U(SoC,T, age), U(SoC, age), U(T, age), U(SoC,T), U(SoC), U(T), U(age), or U; where f(x) means function f of independent variables x.

Each parameterization is preferably associated with a set of parameters, where the set of parameters scale or otherwise relate the independent variable to a dependent variable. For instance, in the parameterization of U(SoC, T)=A*SoC+B*T+C; A, B, and C are the set of parameters.

Each parameterization can be a different model mode in the schedule. However, in some variations, a model can be a subset of or derived from another model. For instance, a 2RC (resistor capacitor) model can be a subset of a 3RC model where a 2RC model can be determined from a 3RC model by changing a column and row of the 3RC model matrix to zero.

Typically, the independent variables will be associated with (e.g., be, be derived from, be associated with, etc.) one or more sensor measurements. However, the independent variables can additionally or alternatively include: states (e.g., estimated by a state estimator), simulated system properties, and/or any suitable variables. When a variable is not directly measured (e.g., is determined by combining one or more other measured quantities), the variable can be referred to as a 'hidden variable.' However, a hidden variable can otherwise be defined.

The parameters (of the parameterized models) can be active or inactive. Active parameters are preferably parameters that are updated during the use of (e.g., evaluation of, training, determination of, etc.) the model. Inactive parameters are preferably parameters that do not change while using the model.

Each model can be associated with one or more submodels. The submodel(s) are preferably distinct (e.g., covariance between models is low), but can be integrated (e.g., have a non-negligible covariance with other submodels). The submodels can include physical models, nonphysical models, and/or any suitable models. The submodels can include local models (e.g., cell models that are specific to a cell, specific to a module, specific to a predetermined number of cells, specific to an external system, specific to a portion of an external system proximal the battery, as shown for example in FIG. 5, etc.), a battery pack model (e.g., including or accounting for each cell of a pack separately or collectively, accounting for each cell in series within a pack, as shown for example in FIG. 6, etc.), a battery module model, an external system model, and/or any suitable models. The submodel(s) can be lumped model(s) (e.g., lumped element models), finite element model(s), numerical model(s), continuous model(s), single particle model(s), and/or any suitable model(s). The submodel(s) can include, for example, a thermal model (e.g., a model for determining the thermal distribution within a battery, battery pack, cell, external system, etc.), a heat generation model (e.g., a model for how much heat is generated during operation of the battery), an electrical model (e.g., RC model, R model, C model, inductance model, equivalent circuit model, etc.), an electrochemical model, a heat transport model (e.g., a model for how heat is transported within and/or between components), a degradation model, an ion transport model (e.g., $Li^+$ transport model), a kinetic model (e.g., for how a system evolves in time, for how a system achieves a thermodynamic equilibrium, etc.), a thermodynamic model (e.g., for an equilibrium state of the battery or system), a quantum mechanical model, and/or any suitable models.

As an illustrative example of scheduler operation, the scheduler can select a model noise covariance (e.g., model noise covariance matrix) from a set of potential model noise covariances, a sensor noise covariance (e.g., sensor noise covariance matrix) from a set of potential sensor noise covariances, one or more active parameters (e.g., an active parameter matrix) from a set of potential active parameters (e.g., where active parameters that are not selected are inactive parameters), active parameter noise covariances (e.g., active parameter noise covariance matrix, where terms associated with inactive parameters can be set to zero based on which parameters are selected to be active parameters) from a set of active parameter noise covariances, one or more hyperparameters (e.g., hyperparameter matrix) from a set of hyperparameters, initial covariance estimates (e.g., initial covariance estimate matrix) from a set of initial covariance estimates, and/or a model (e.g., a thermal model, an electrical model, etc.) from a set of models. However, the scheduler can select any suitable information. However, a scheduler can operate in any manner.

In a first illustrative example, a first hyperparameter mode can be selected when an estimated state of charge of the battery (SoC) is less than 65% and a second hyperparameter mode can be selected when the SoC is greater than or equal to 65%. In a second illustrative example, a first hyperparameter mode can be selected when the SoC is less than 65% and a first sensor noise covariance mode is selected; a second hyperparameter mode can be selected when the SoC is less than 65% and a second sensor noise covariance mode is selected; a third hyperparameter mode can be selected when the SoC is greater than or equal to 65% and the first sensor noise covariance mode is selected; and a fourth hyperparameter mode can be selected when the SoC is greater than or equal to 65% and the second sensor noise covariance mode is selected. However, the mode can otherwise be selected.

Typically, different conditions will lead to different mode(s) being selected (and/or necessary). However, different conditions can lead to the same mode selection (e.g., two or more modes can have the same information such as two hyperparameter modes can have the same hyperparameter vectors but different conditions; a plurality of conditions can be associated with a single mode; etc.).

The state estimator 140 preferably functions to estimate a state (e.g., a current state, a future state, etc.) of the external system and/or battery. Inputs to the state estimator can include: sensor data, filtered data, schedule(s) (e.g., selected mode(s) such as model(s), model noise covariance, hyperparameters, sensor noise covariance, active parameters, inactive parameters, active parameter covariances, etc.), battery properties, external system properties, a load profile, and/or any suitable inputs.

Outputs (e.g., states) from the state estimator can include: states of the battery (e.g., predicted state of the battery during or after operating the battery), battery properties (e.g., true battery properties, denoised battery properties, etc.), states of the external system, parameters of the model (e.g., active parameters of the model), model error (e.g., estimates of an error in the model parameters), time (e.g., lifetime of the battery), and/or any suitable states. For example, outputs (e.g., states determined by) of the state estimator can include a state of charge, temperature, electrochemical state, model parameters (such as charge capacity and/or other parameters that determine the battery's general performance capability), and/or any suitable outputs.

The state estimator can include: a Kalman filter, an extended Kalman filter, an unscented Kalman filter, an ensemble Kalman filter, a look-up table, a Markov Chain Monte Carlo technique, linearization techniques, machine learning techniques (e.g., a neural network), and/or any suitable particle filter, sequential Monte Carlo technique, or other state estimator. The state estimator (e.g., type, where the state estimator runs, etc.) can depend on an accuracy of the estimated state (e.g., a target accuracy, based on the application, etc.), an amount of processing power available, and/or otherwise depend on any suitable properties. In some variants, a plurality of state estimators can be used. For instance, a first state estimator can operate on a cloud computing server and provide information to a second state estimator operating on a local computing system (e.g., local to the battery-operated system). In a specific example of a distributed state estimator system, an unscented Kalman filter can be implemented in a cloud computing server where the unscented Kalman filter can be used to generate a look-up table and system of equations (e.g., linearized models) and/or a Kalman filter that can run on the local computing system. In this specific example, the scheduler is typically used to determine state estimator operation (e.g., modes) of the unscented Kalman filter (e.g., which can impact the resulting look-up tables and/or set of equations) however, the scheduler can additionally or alternatively impact the operation and/or use of the embedded state estimator (and/or associated equations or models) and/or any suitable state estimator(s).

Figure 7:
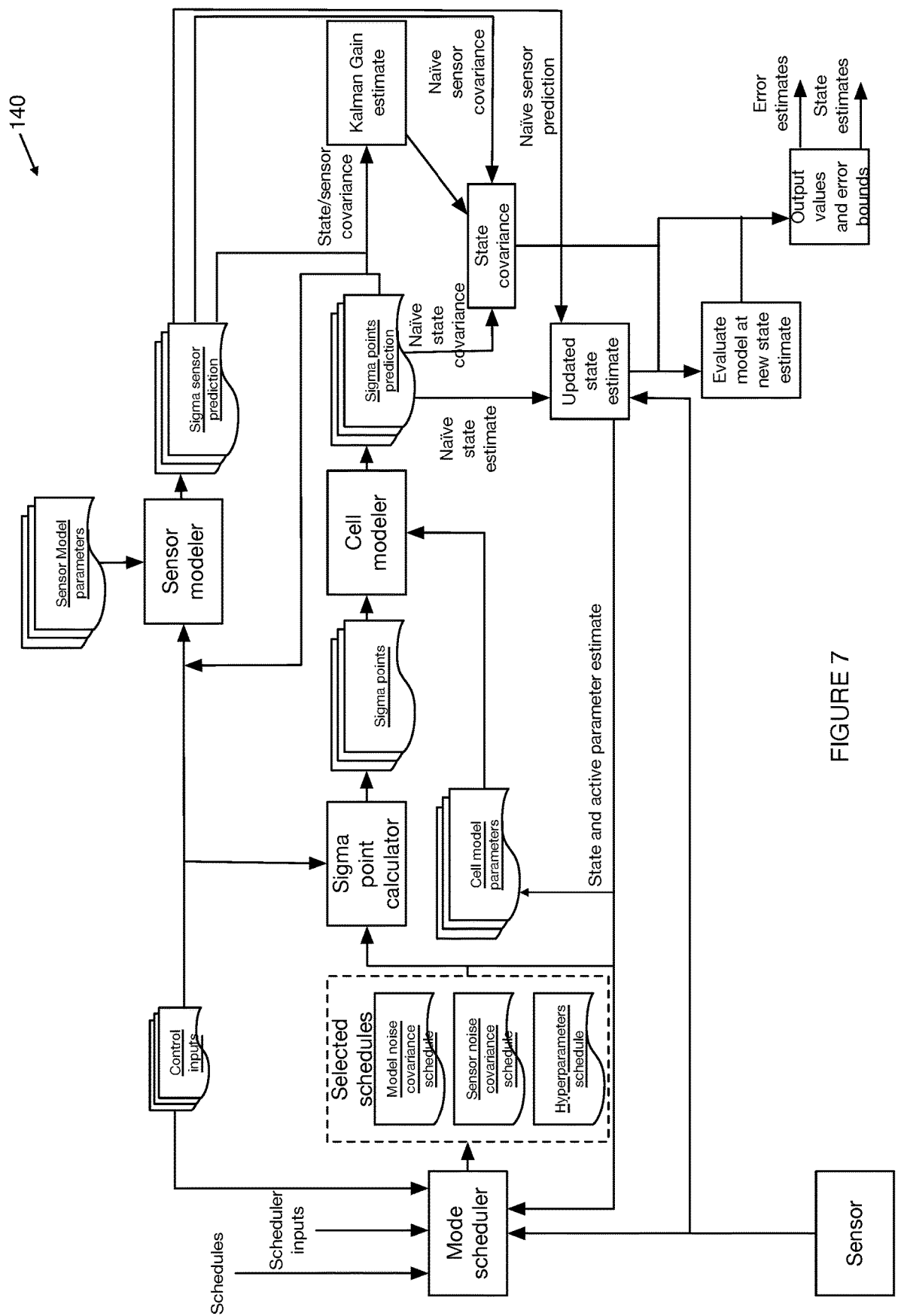
FIG. 7 is a schematic representation of an exemplary state estimator.

In an illustrative example, as shown for instance in FIG. 7, a state estimator (e.g., an unscented Kalman filter) can determine a set of sigma points (e.g., based on the selected mode, control inputs, sensor readings, state estimates, active parameter estimates, etc.), determining naïve state estimates and/or covariances for each of the sigma points (e.g., using a battery model; battery model mode(s) such as battery model mode, battery model noise covariance mode, etc.; etc.), determining naïve sensor predictions and/or covariances for each of the sigma points (e.g., using a sensor modeler; sensor model modes such as sensor model mode, sensor model noise covariance mode, etc.; etc.), determining a Kalman gain (e.g., based on the naïve state covariance and/or naïve sensor covariance), determining a state covariance (e.g., based on the Kalman gain, the naïve state covariance, the naïve sensor covariance, etc.), updating the estimated state (e.g., the naïve state prediction, the naïve sensor prediction, sensor data, etc.), evaluating the model based on the updated state estimate, and outputting the battery state (e.g., updated state, state determined by evaluating the model based on the updated state estimate, etc.) and/or associated error bounds (e.g., estimated or determined based on the state covariance). However, the state estimator can include any suitable processes.

In some examples, the state estimator can be a state estimator as disclosed in U.S. patent application Ser. No. 17/314,867, titled 'BATTERY ANALYSIS SYSTEM AND METHOD' filed 7 May 2021 which is incorporated in its entirety by this reference. However, any suitable state estimator can be used.

4. Method.

As shown for example in FIG. 3, the method can include measuring battery data (e.g., battery properties, sensor data, sensor readings, etc.); optionally, estimating a battery state (e.g., using a state estimator); selecting one or more modes (e.g., using a scheduler); estimating the battery state based on the one or more modes (e.g., using a state estimator); optionally, transmitting the battery state and/or operating the battery(s) based on the estimated battery state; and/or any suitable steps. The method and/or steps thereof can be performed iteratively, sequentially, asynchronously, delayed, and/or with any suitable timing or relative timing.

Measuring battery data is preferably performed by one or more sensors. However, the battery data can additionally or alternatively be inferred (e.g., from one or more sensor readings), and/or can otherwise be measured and/or determined.

Estimating a battery state (e.g., estimating a battery state prior to selecting a mode) can function to provide an initial estimate of a battery state. The initial estimated battery state can be used to improve a mode selection (e.g., by providing a battery state to be used as an input to the scheduler). The battery state is preferably determined by a state estimator. However, a battery state could be determined using any component.

Prior to selecting mode(s), the battery state can be estimated using (e.g., the state estimator can operate using) a default mode, using freely varying parameters (e.g., using a naïve state estimator), using initial mod(e), mode(s) selected using a subset of scheduler inputs (e.g., modes selected using sensor data, modes selected using a subset of sensor data, modes selected without using a battery state as an input, etc.), prior mode(s) (e.g., from a prior instance of the scheduler operation, for a previous charging and/or discharging cycle, from a prior set of sensor readings, etc.), using parameters from modes selected blind to a possible state of the battery, using previously selected modes (e.g., from prior implementations of the method, from prior battery operations, etc.), and/or can otherwise be determined.

Selecting one or more modes can function to determine (e.g., identify, choose, etc.) modes (e.g., state estimator conditions, state estimator operation conditions, state estimator operation information, state estimator information, information used by a state estimator to determine a state, etc.) from the schedule. The one or more modes are preferably determined using a scheduler (e.g., as described above, a component that operates in a manner analogous to a scheduler as described above, etc.). However, additionally or alternatively, the schedule(s) can be determined using any suitable component.

In some variants, the mode can be selected iteratively. For instance, a first battery state can be estimated and used to inform or select the mode(s); the mode(s) can be used to estimate a second battery state which can then be used to update or select the mode(s). The iterations can be performed a predetermined number of times, until a predetermined time has lapsed, until the selected mode does not change, until the predicted battery state changes by less than a threshold amount (e.g., that can depend on the battery application), until new sensor readings are available, and/or until any suitable condition is met.

Selecting the one or more modes can include transmitting the one or more modes. For instance, the modes can be transmitted to a local computing system (e.g., operating on computing system collocated with the battery, to a local state estimator), to a remote computing system (e.g., to a database, to a remote state estimator, to a cloud server, etc.), and/or to any suitable computing system.

Optionally, transmitting the battery state functions to transmit the battery state to a battery or fleet operator. The battery state can be transmitted to an operator device (e.g., smart phone, smart device, computer, laptop, etc.), display, and/or to any suitable device. The current battery state, a future battery state (e.g., simulated battery state, forward-estimated battery state, etc.), and/or historic battery state can be transmitted.

Transmitting the battery state can include: displaying the battery state (and/or any suitable states thereof), operating the external system based on the battery state, providing recommended or updated operation instructions for an external system (e.g., providing a recommend operator profile such as aggressiveness, defensiveness, etc.; a load profile; a path; an operation time; an operation order; stops to make; an acceleration profile; a velocity profile; a timing for performing state estimation; charging time; extent of charging before operation; charge rate; etc.), informing battery design and/or selection (e.g., the types and/or number of sensors; the data acquisition rate; the anode, cathode, electrolyte, and/or separator; cell size, cell arrangement, cell number, etc.; pack size, pack geometry, thermal interfaces between cells, between the pack and the external system, etc.; etc.), issuing a flag or warning (e.g., for an anomaly, for a nonvalidated mode or nonvalidated conditions, potential safety event, potential fault, etc.) and/or otherwise process or operate on the battery state.

The methods of the preferred embodiment and variations thereof can be embodied and/or implemented at least in part as a machine configured to receive a computer-readable medium storing computer-readable instructions. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A method comprising:
   measuring sensor data comprising a voltage, a current, and a temperature associated with a battery;
   estimating an initial battery state based on the sensor data using a state estimator operating with an initial set of state estimator conditions;
   selecting an updated set of state estimator conditions from a set of state estimator conditions based on the initial battery state and a mode selection input, wherein the set of state estimator conditions comprise:
   a model noise covariance set;
   an active parameters set;
   a sensor noise covariance set;
   an active parameter noise covariance set;
   an initial covariance estimate set; and
   a model set; and
   determining an updated battery state based on the voltage, the current, and the temperature using the state estimator operating with the updated set of state estimator conditions.

2. The method of claim 1, wherein the active parameter set depends on the model noise covariance set.

3. The method of claim 1, wherein selecting an updated set of state estimator conditions comprises selecting a model noise covariance from the model noise covariance set, one or more active parameters from the active parameters set, a sensor noise covariance from the sensor noise covariance set, an active parameter noise covariance from the active parameter noise covariance set, an initial covariance estimate from the initial covariance estimate set, and a model from the model set.

4. The method of claim 1, wherein selecting the updated set of state estimator conditions and determining the updated battery state are performed iteratively.

5. The method of claim 1, wherein selecting an updated set of state estimator conditions comprises:
   selecting a first set of state estimator conditions when a state of charge of the battery is less than a first threshold;
   selecting a second set of state estimator conditions when the state of charge of the battery is greater than the first threshold and less than a second threshold, wherein the second threshold is greater than the first threshold; and
   selecting a third set of state estimator conditions when the state of charge of the battery is greater than the second threshold.

6. The method of claim 5, wherein the first set of state estimator conditions comprise a first set of matrices, wherein the second set of state estimator conditions comprise a second set of matrices, and wherein the third set of state estimator conditions comprise a third set of matrices, wherein the first, second, and third set of matrices are distinct from one another.

7. The method of claim 6, wherein each of the first, second and third set of matrices comprise a process covariance matrix and an active parameter matrix.

8. The method of claim 5, wherein after the second set of state estimator conditions are selected and a second state of charge of the battery is received that is less than the first threshold, switching from the second set of state estimator conditions to the first set of state estimator conditions when the second state of charge of the battery is less than a third threshold, wherein the third threshold is less than the first threshold.

9. The method of claim 8, wherein at least one of the first threshold, the second threshold, or the third threshold depends on an amount of time since a set of state estimator conditions was selected.

10. The method of claim 1, wherein the mode selection input comprises an operation time of the battery, a system operation time, the sensor data, control inputs for a desired operation profile of the battery, and a mode request.

11. The method of claim 1, wherein the state estimator comprises a look-up table, wherein elements of the look-up table depend on the state estimator conditions.

12. A method comprising:
measuring sensor data comprising a voltage, a current, and a temperature associated with a battery;
estimating an initial battery state based on the sensor data using a state estimator operating with an initial set of state estimator conditions;
selecting an updated set of state estimator conditions from a set of state estimator conditions based on the initial battery state and a mode selection input, wherein the mode selection input comprises an operation time of the battery, a system operation time, the sensor data, control inputs for a desired operation profile of the battery, and a mode request; and
determining an updated battery state based on the voltage, the current, and the temperature using the state estimator operating with the updated set of state estimator conditions.

13. The method of claim 12, wherein selecting the updated set of state estimator conditions and determining the updated battery state are performed iteratively.

14. The method of claim 12, wherein selecting an updated set of state estimator conditions comprises:
selecting a first set of state estimator conditions when a state of charge of the battery is less than a first threshold;
selecting a second set of state estimator conditions when the state of charge of the battery is greater than the first threshold and less than a second threshold, wherein the second threshold is greater than the first threshold; and
selecting a third set of state estimator conditions when the state of charge of the battery is greater than the second threshold.

15. The method of claim 14, wherein the first set of state estimator conditions comprise a first set of matrices, wherein the second set of state estimator conditions comprise a second set of matrices, and wherein the third set of state estimator conditions comprise a third set of matrices, wherein the first, second, and third set of matrices are distinct from one another.

16. The method of claim 15, wherein each of the first, second and third set of matrices comprise a process covariance matrix and an active parameter matrix.

17. The method of claim 14, wherein after the second set of state estimator conditions are selected and a second state of charge of the battery is received that is less than the first threshold, switching from the second set of state estimator conditions to the first set of state estimator conditions when the second state of charge of the battery is less than a third threshold, wherein the third threshold is less than the first threshold.

18. The method of claim 17, wherein at least one of the first threshold, the second threshold, or the third threshold depends on an amount of time since a set of state estimator conditions was selected.

19. The method of claim 12, wherein the state estimator comprises a look-up table, wherein elements of the look-up table depend on the state estimator conditions.

* * * * *